(12) United States Patent
Hosokawa et al.

(10) Patent No.: US 8,759,971 B2
(45) Date of Patent: Jun. 24, 2014

(54) SEMICONDUCTOR APPARATUS

(75) Inventors: Ryuji Hosokawa, Kanagawa (JP); Tsutomu Kojima, Oita (JP); Tatsuo Shiotsuki, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/219,158

(22) Filed: Aug. 26, 2011

(65) Prior Publication Data
US 2012/0049355 A1      Mar. 1, 2012

(30) Foreign Application Priority Data

Aug. 31, 2010   (JP) .................................. 2010-194849

(51) Int. Cl.
*H01L 23/498*   (2006.01)

(52) U.S. Cl.
USPC .................... 257/737; 257/E23.068; 257/738; 257/772

(58) Field of Classification Search
USPC .................... 257/737, 778, E21.511, E21.503
See application file for complete search history.

(56) References Cited

U.S. PATENT DOCUMENTS

| | | | |
|---|---|---|---|
| 6,291,264 B1* | 9/2001 | Tang et al. | 257/E21.503 |
| 6,329,608 B1* | 12/2001 | Rinne et al. | 174/261 |
| 6,555,917 B1* | 4/2003 | Heo | 257/777 |
| 2010/0078791 A1* | 4/2010 | Yim et al. | 257/686 |
| 2011/0068465 A1* | 3/2011 | Shen et al. | 257/737 |

FOREIGN PATENT DOCUMENTS

| | | |
|---|---|---|
| JP | 2002-118207 | 4/2002 |
| JP | 2004-193174 | 7/2004 |
| JP | 2007-059596 | 3/2007 |
| JP | 4415717 | 12/2009 |

OTHER PUBLICATIONS

Notice of Rejection issued by the Japanese Patent Office on Feb. 5, 2013, for Japanese Patent Application No. 2010-194849, and partial English-language translation thereof.
Notice of Rejection for Japanese Application No. 2010-194849, dated Jan. 7, 2014 (2 pages).

* cited by examiner

*Primary Examiner* — Marcos D. Pizarro
*Assistant Examiner* — Quinton Brasfield
(74) *Attorney, Agent, or Firm* — Finnegan, Henderson, Farabow, Garrett & Dunner, L.L.P.

(57) ABSTRACT

A semiconductor apparatus in a preferred embodiment includes: a substrate; a first chip provided on the substrate; a solder bump formed on the first chip; a solder dam arranged in substantially a rectangular and annular manner outside around the solder bump on the first chip by alternately connecting four sides and four quarter or less arcs; an electrode pad placed outside of the solder dam in the first chip; a second chip provided on the first chip in electric connection to the first chip via the solder bump; and an under-fill material filling a clearance between the first chip and the second chip inside of the solder dam. Here, a difference between an inner diameter and an outer diameter of the arc is 60 μm or more whereas the center radius of the arc is greater than 207.5 μm.

16 Claims, 8 Drawing Sheets

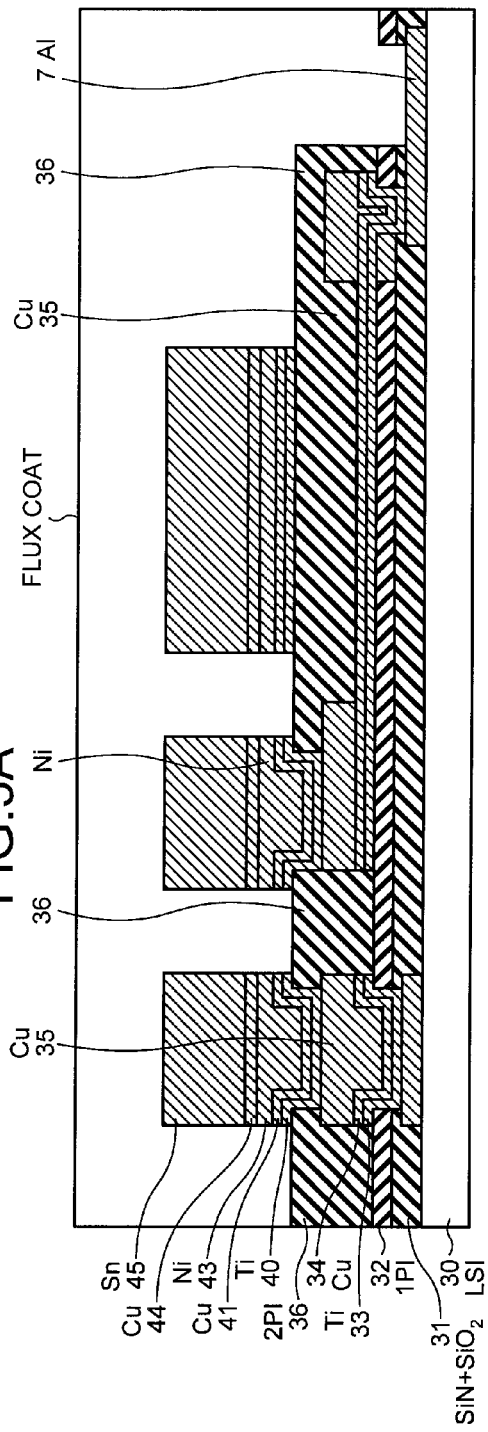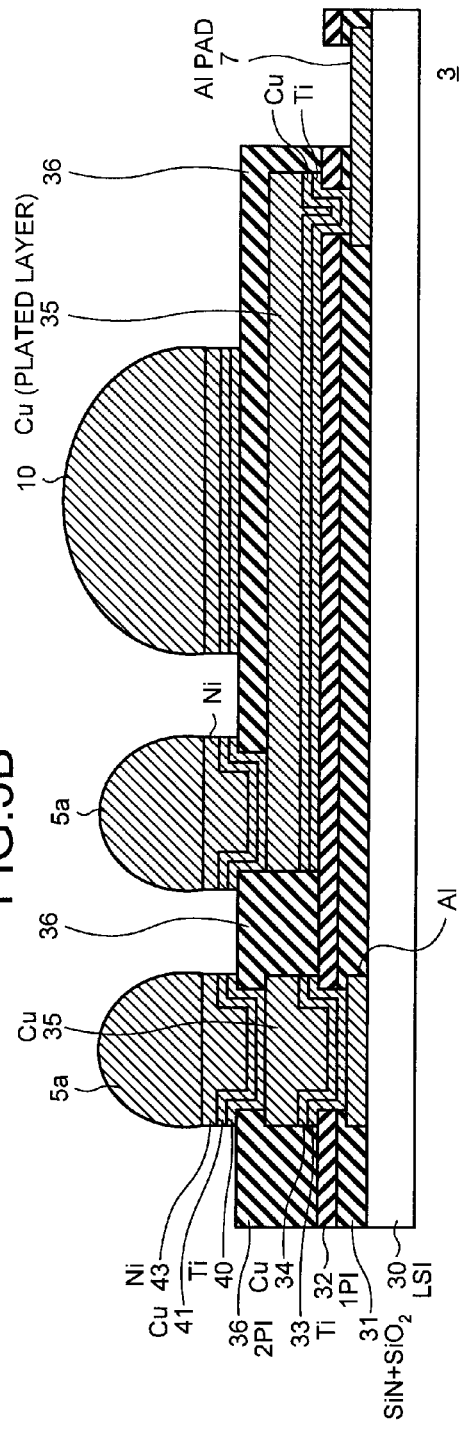

PREFERRED EMBODIMENT ACCORDING TO THE PRESENT INVENTION

PREFERRED EMBODIMENT ACCORDING TO THE PRESENT INVENTION

SEMICONDUCTOR APPARATUS

CROSS-REFERENCE TO RELATED APPLICATIONS

This application is based upon and claims the benefit of priority from the prior Japanese Patent Application No. 2010-194849, filed on Aug. 31, 2010; the entire contents of which are incorporated herein by reference.

FIELD

The present embodiment generally relates to a semiconductor apparatus.

BACKGROUND

There has been known the COC (Chip on Chip) technique for laminating a plurality of semiconductor devices such as a memory and a logic in a three-dimensional fashion to achieve high performance, multiple functions, and miniaturization of electronic equipment such as mobile equipment. Among such semiconductor apparatuses utilizing the COC technique, a semiconductor apparatus having two pieces of semiconductor devices, which are micro-bump connected to each other, is advantageous to the miniaturization and an increase in data transfer speed between chips, and therefore, has been frequently used in various kinds of electronic equipment.

Such a semiconductor apparatus having the COC structure utilizing the micro-bump connection has been conventionally fabricated by joining respective terminals of surfaces (circuit forming surfaces) of the two pieces of semiconductor devices via a solder bump, followed by filling a clearance defined between the upper and lower semiconductor devices with an under-fill material (i.e., an UF resin). The solder bump is formed on a terminal of at least either one of the semiconductor devices to be joined to each other, and then, is melted by reflowing, and thus, the semiconductor devices are joined to each other.

A lead-free solder (such as Sn—Cu or Sn—Ag) is generally used as the solder bump from the viewpoint of conservation of the environment. An annular dam is formed on the lower semiconductor device so as to prevent the resin from flowing in an electrode pad outside of a specified region when the clearance is filled with the under-fill material.

However, in the case where the dam is formed of the solder, metal of a solder material is plated on the semiconductor device, to be then melted by reflowing. During this reflowing, the solder is coagulated at mainly the corner of the dam, and therefore, a solder sump is generated, thereby inducing a crack on a wafer or deficient bump connection.

In view of the above, a technique capable of suppressing the generation of a solder sump on a semiconductor device has been demanded.

BRIEF DESCRIPTION OF THE DRAWINGS

FIG. 5A is a cross-sectional view illustrating the state in which the solder bump and the solder dam are formed at the same time in the preferred embodiment;

FIG. 5B is another cross-sectional view illustrating the state in which the solder bump and the solder dam are formed at the same time in the preferred embodiment;

DETAILED DESCRIPTION

A semiconductor apparatus in a preferred embodiment includes: a semiconductor substrate; a first semiconductor chip provided on the semiconductor substrate; a solder bump formed on the first semiconductor chip; a solder dam arranged in substantially a rectangular and annular manner outside around the solder bump on the first semiconductor chip by alternately connecting four sides and four quarter or less arcs; an electrode pad placed outside of the solder dam in the first semiconductor chip; a second semiconductor chip provided on the first semiconductor chip in electric connection to the first semiconductor chip via the solder bump; and an under-fill material filling a clearance between the first semiconductor chip and the second semiconductor chip inside of the solder dam. Here, a difference between an inner diameter and an outer diameter of the arc is 60 µm or more, and further, the center radius of the arc is greater than 207.5 µm.

A semiconductor apparatus in a preferred embodiment will be described below in details with reference to the attached drawings. Incidentally, the present invention is not limited to the preferred embodiment.

Preferred Embodiment

Figure 1:
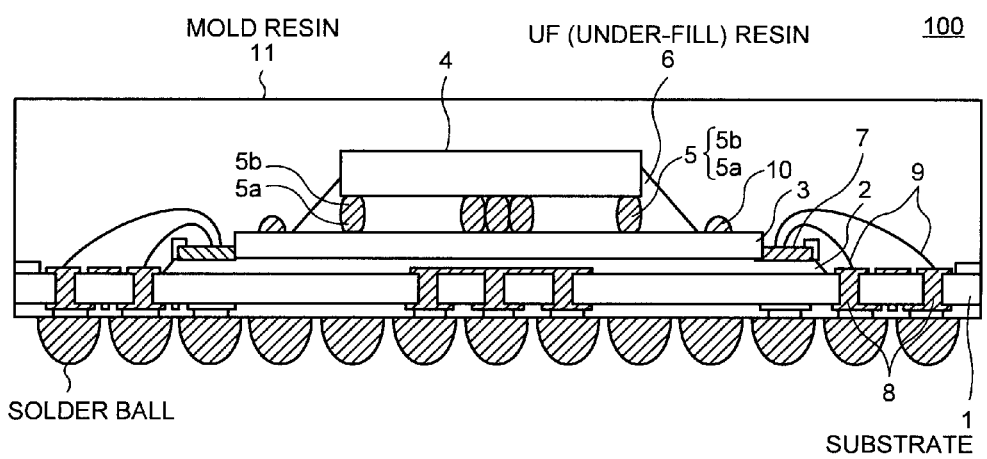
FIG. 1 is a cross-sectional view schematically illustrating the configuration of a semiconductor apparatus in a preferred embodiment.

FIG. 1 is a cross-sectional view schematically illustrating the configuration of a semiconductor apparatus 100 in a first preferred embodiment. The semiconductor apparatus 100 is provided with a first semiconductor chip (i.e., a lower chip) 3 on a substrate 1 via a mount resin 2. The first semiconductor chip 3 is exemplified by a memory chip. The semiconductor apparatus 100 has a COC structure in which a second semiconductor chip (i.e., an upper chip) 4 is micro-bump connected onto the first semiconductor chip 3. The second semiconductor chip 4 is exemplified by a logic chip. Alternatively, the first semiconductor chip 3 may be exemplified by a logic chip whereas the second semiconductor chip 4 may be exemplified by a memory chip.

Figure 2:
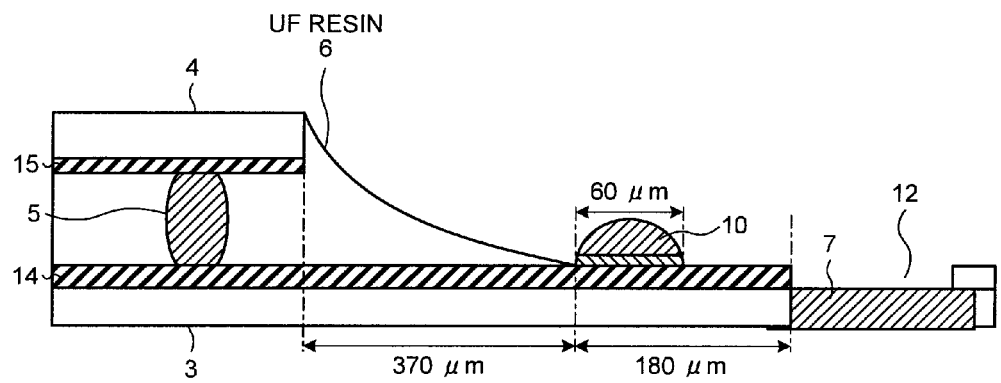
FIG. 2 is a cross-sectional view illustrating the cross sections of a first semiconductor chip and a second semiconductor chip in more details in the preferred embodiment.

FIG. 2 is a cross-sectional view illustrating the cross sections of the first semiconductor chip 3 and the second semiconductor chip 4 in more details. The first semiconductor chip 3 is provided with an electrode pad (i.e., an electrode) 7 and an insulating resin hardening film 14 having an opening 12 formed in such a manner as to expose the surface of the electrode pad 7. The electrode pad 7 is made of, for example, aluminum. The insulating resin hardening film 14 is made of, for example, polyimide. Meanwhile, the second semiconductor chip 4 also has an insulating resin hardening film 15 at the surface (i.e., a terminal surface) thereof.

As illustrated in FIGS. 1 and 2, the first semiconductor chip 3 and the second semiconductor chip 4 are joined to each other at the respective terminal surfaces via solder bumps 5, and further, a clearance defined therebetween is filled with an UF resin (i.e., an under-fill material) 6. The solder bump 5 is obtained by integrally welding a solder bump 5a formed on each of terminals, not illustrated, of the first semiconductor chip 3 and another solder bump 5b formed on each of terminals, not illustrated, of the second semiconductor chip 4 by reflowing.

The solder bump 5 is made of a metallic material having a coagulation point of 220° C. or higher and 240° C. or lower such as SnCu (having a coagulation point of 227° C.) or SnAg (having a coagulation point of 221° C.). The radius and pitch of the bump are, for example, about 5 μm to about 50 μm and about 10 μm to about 100 μm, respectively. Here, the peripheral edge of the first semiconductor chip 3 projects outside of the periphery of the second semiconductor chip 4. The above-described electrode pad 7 is formed on the projecting peripheral edge.

As illustrated in FIG. 2, a solder dam 10 is interposed between the solder bump 5a on the first semiconductor chip 3 and the electrode pad 7, and is adapted to block the UF resin 6 from flowing out toward the periphery. In this manner, the electrode pad 7 disposed further outside of the solder dam 10 is protected from the UF resin 6, to be thus connected to electrode pads 8 in the substrate 1 via wires 9. The height of the solder dam 10 is set to about 10 μm to about 40 μm.

The mount resin 2, the first semiconductor chip 3, the UF (under-fill) resin 6, the second semiconductor chip 4, the solder dam 10, the electrode pads 7 and 8, and the wires 9 on the substrate 1 are covered with a mold resin 11 as a whole.

Figure 3:
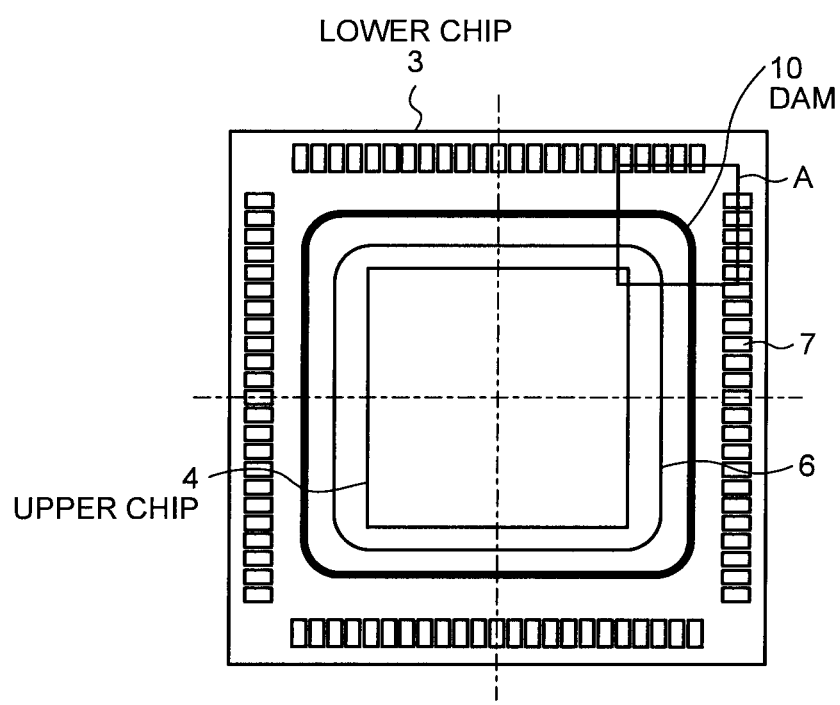
FIG. 3 is a top view illustrating the first semiconductor chip in the preferred embodiment.

FIG. 3 is a top view illustrating the first semiconductor chip 3. FIG. 3 illustrates the second semiconductor chip 4 and the electrode pads 7 on the first semiconductor chip 3. Furthermore, as illustrated, the annular solder dam 10 is provided between the second semiconductor chip 4 and the electrode pads 7. The solder dam 10 is formed into substantially a rectangular and annular shape such as a square or a rectangle, and further, each of its four corners is formed into a quarter arc (90°), as illustrated in, for example, FIG. 3. The four corners and four straight sides are alternately connected to each other, thereby forming the dam into one continuous ring (i.e., a frame) as a whole.

As described above, the first semiconductor chip 3 and the second semiconductor chip 4 are electrically connected to each other via the solder bump 5. Here, in forming the semiconductor apparatus 100, the first semiconductor chip 3 having the solder bump 5a and the second semiconductor chip 4 having the solder bump 5b are stuck to each other by welding the bumps 5a and 5b to each other. The solder dam 10 formed on the first semiconductor chip 3 is formed simultaneously with the formation of the solder bump 5a on the first semiconductor chip 3, as described below.

Figure 4A:
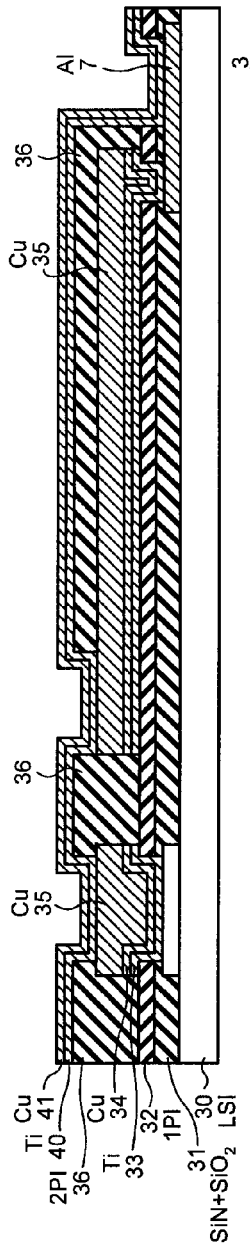
FIG. 4A is a cross-sectional view illustrating the state in which a solder bump and a solder dam are formed at the same time in the preferred embodiment.

FIGS. 4A, 4B, 4C, 5A, and 5B are cross-sectional views sequentially illustrating the simultaneous formation of the solder bump 5a and the solder dam 10 in the first semiconductor chip 3. First, as illustrated in FIG. 4A, under barrier metals, that is, Ti 40 and Cu 41 are formed on the first semiconductor chip 3 by sputtering. Although an LSI 30, the electrode pad 7 made of Al, an insulating layer 31 made of SiN and SiO, a first polyimide layer 32, under barrier metals, that is, Ti 33 and Cu 34, a Cu wiring plated layer 35, and a second polyimide layer 36 have been already formed on the first semiconductor chip 3, as illustrated, the structure is not limited to this.

Figure 4B:
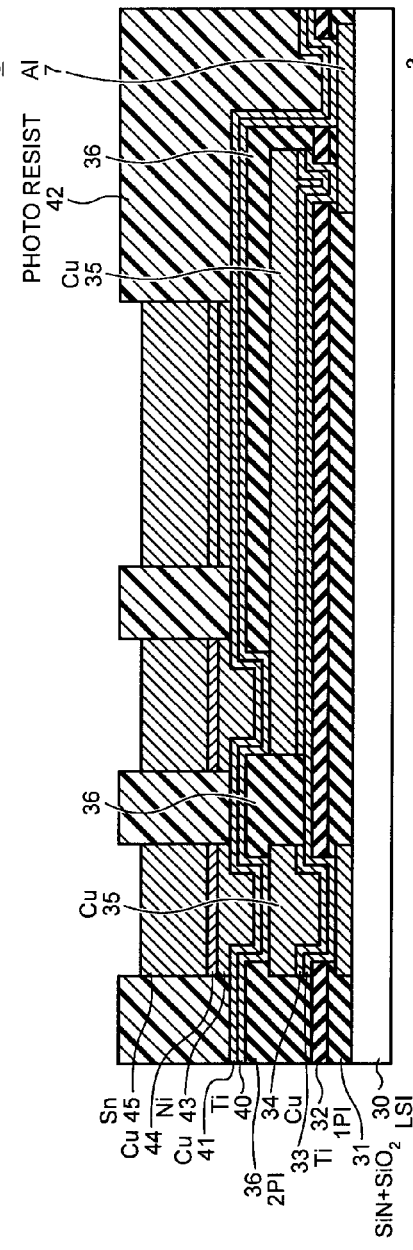
FIG. 4B is another cross-sectional view illustrating the state in which the solder bump and the solder dam are formed at the same time in the preferred embodiment.

Thereafter, as illustrated in FIG. 4B, a photoresist (plating resist) 42 is applied, followed by exposing and developing, not illustrated. In this manner, a region, from which the photoresist 42 is removed for forming the bump and the dam, is plated with Ni 43, and further, with Cu 44 and Sn 45 in lamination. The lateral width of the region, from which the photoresist 42 is removed for forming the bump and the dam, is 20 μm with respect to each of the bumps whereas 60 μm or 75 μm with respect to the dam. At this time, the total height of the Cu 44 plated layer and the Sn 45 plated layer is 15.55 μm with respect to both of portions where the bump and the dam are to be formed, as viewed from the top of Ni 43.

Figure 4C:
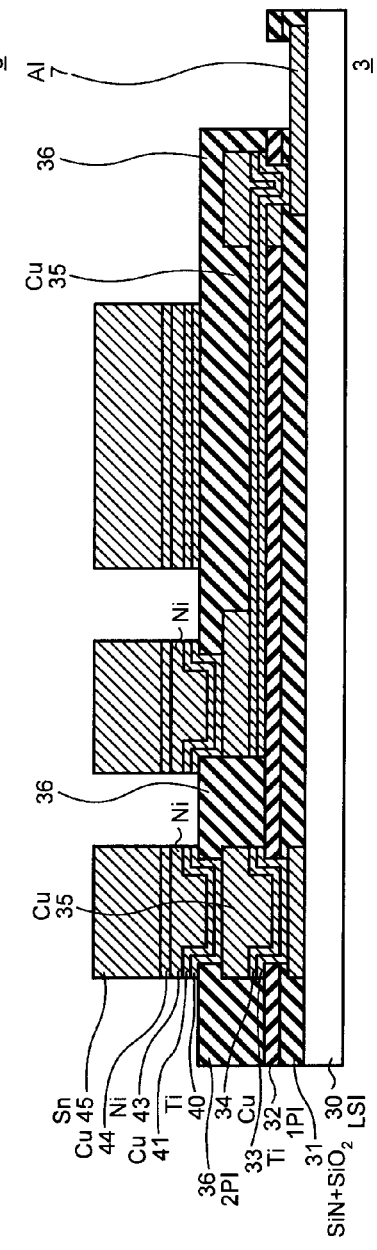
FIG. 4C is a further cross-sectional view illustrating the state in which the solder bump and the solder dam are formed at the same time in the preferred embodiment.

Subsequently, as illustrated in FIG. 4C, the photoresist 42 is removed, and then, the under barrier metals, that is, Cu 41 and Ti 40 are etched. Thereafter, as illustrated in FIG. 5A, the SnCu solder bump 5a and the solder dam 10 are formed by coating with flux and reflowing (heating) (reflowing). FIG. 5B illustrates the state after the flux is cleansed. At this time, the height up to the top of the bump 5a is 18±2.7 μm, and further, the height up to the top of the solder dam 10 is 20±3 μm, as viewed from the top of Ni 43.

In the case where the solder bump 5a and the solder dam 10 are formed of SnAg in place of SnCu, SnAg is plated at one time with an SnAg plating solution after plating Ni 43 illustrated in FIG. 4B. The following processes are the same as those illustrated in FIGS. 4C, 5A, and 5B.

Figure 6A:
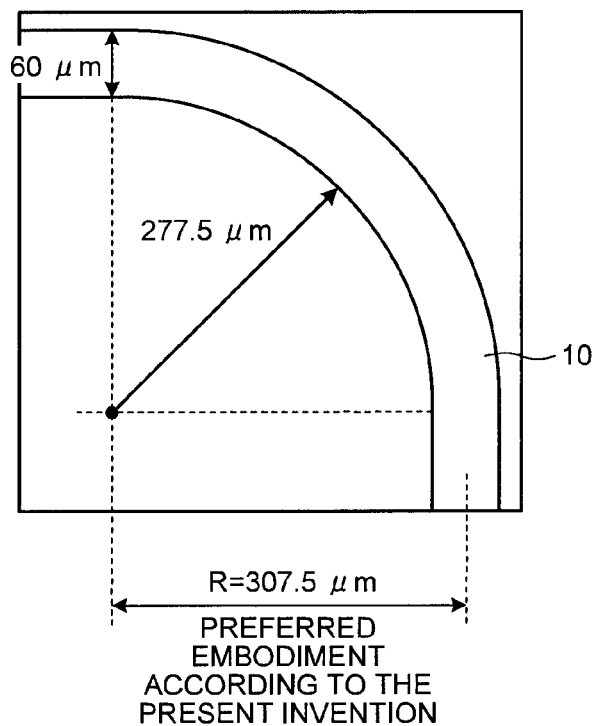
FIG. 6A is a top view illustrating, in enlargement, a portion A of a corner (an arc) of the dam in the preferred embodiment illustrated in FIG. 3.
Figure 6B:
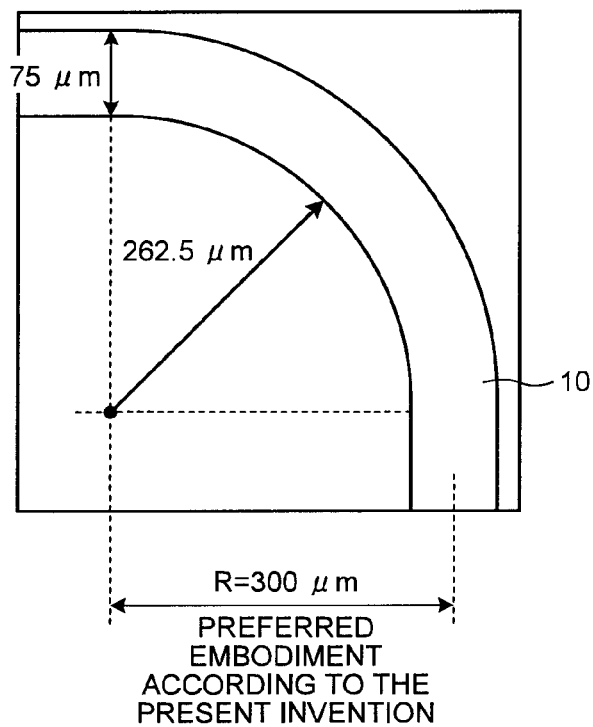
FIG. 6B is a top view illustrating, in enlargement, the portion A of the corner (the arc) of the dam in the preferred embodiment illustrated in FIG. 3.

In the present preferred embodiment, the region, from which the photoresist 42 is removed in the process illustrated in FIG. 4B, is formed into the shape of the solder dam 10 illustrated in FIG. 3 so as to form the annular solder dam 10 illustrated in FIG. 3. FIGS. 6A and 6B are top views illustrating, in enlargement, a portion A of the corner (the arc) of the dam 10 in the preferred embodiment illustrated in FIG. 3. In FIG. 6A, the width of the dam 10, that is, a difference between the inner diameter and the outer diameter of the arc is 60 μm whereas the radius R of the corner (i.e., the center radius of the arcuate portion) is 307.5 μm. Reference character R represents a radius of an arc passing the center of the width of the dam 10, and therefore, the inner diameter of the corner is 277.5 μm in FIG. 6A, as illustrated. In FIG. 6B, the width of the dam 10, that is, a difference between the inner diameter and the outer diameter of the arc is 75 μm whereas the radius R of the corner is 300 μm. Consequently, the inner diameter of the corner is 262.5 μm in FIG. 6B.

Figure 7:
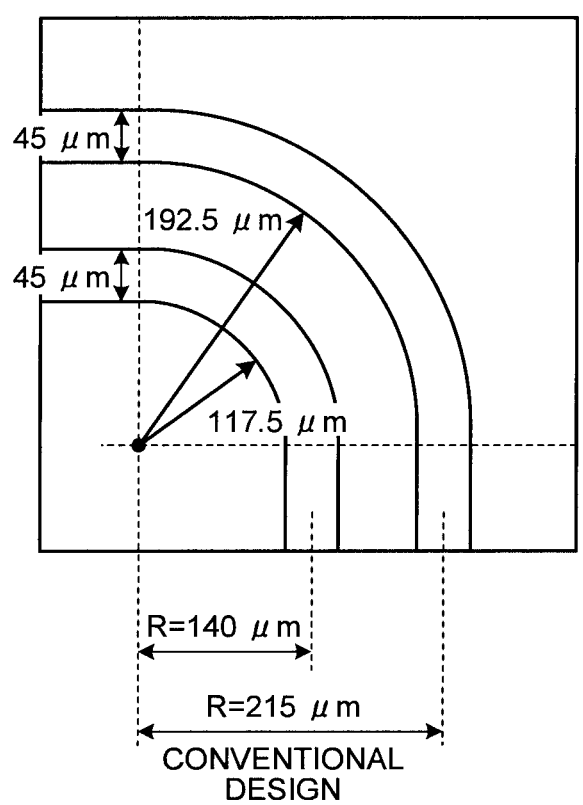
FIG. 7 is a top view illustrating a design of a conventional dam.
Figure 8A:
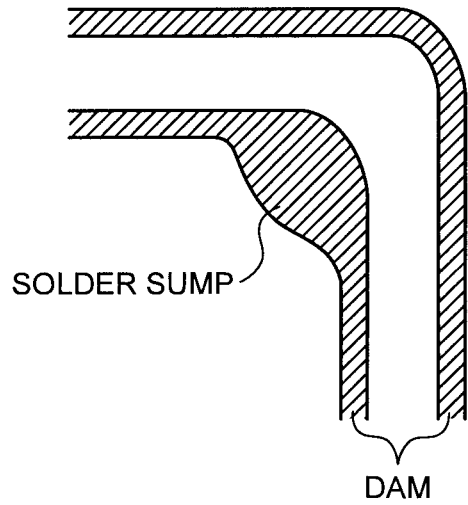
FIG. 8A is a view illustrating a solder sump in the design of the conventional dam.
Figure 8B:
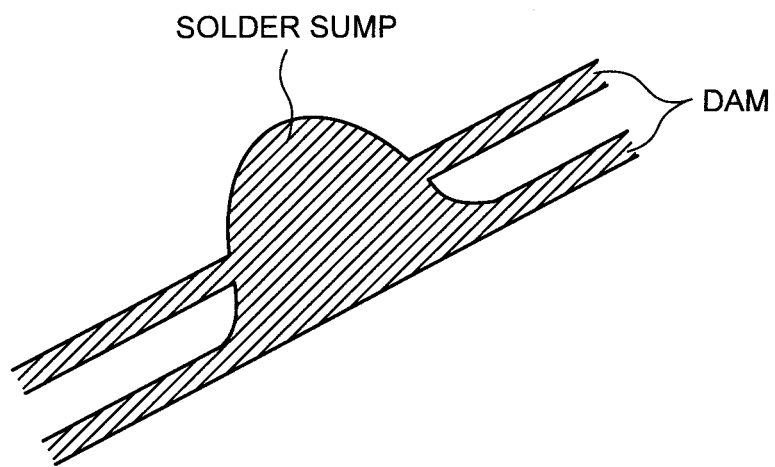
FIG. 8B is a view illustrating the solder sump in the design of the conventional dam.

In contrast, FIG. 7 exemplifies a design of a conventional dam. In FIG. 7, the width of each of dams is 45 μm. However, radii R of corners are 140 μm and 215 μm. When the dams are designed in the prior art, a solder sump is generated when a solder is melted by reflowing (wet back process), as described above, as illustrated in FIGS. 8A and 8B, in either of the case where a single annular dam is formed and the case where an inner annular dam and an outer annular dam covering the inner annular dam are formed in a dual dam structure. In contrast, no solder sump is generated in the dam 10 in the present preferred embodiment illustrated in FIGS. 6A and 6B.

Figure 9:
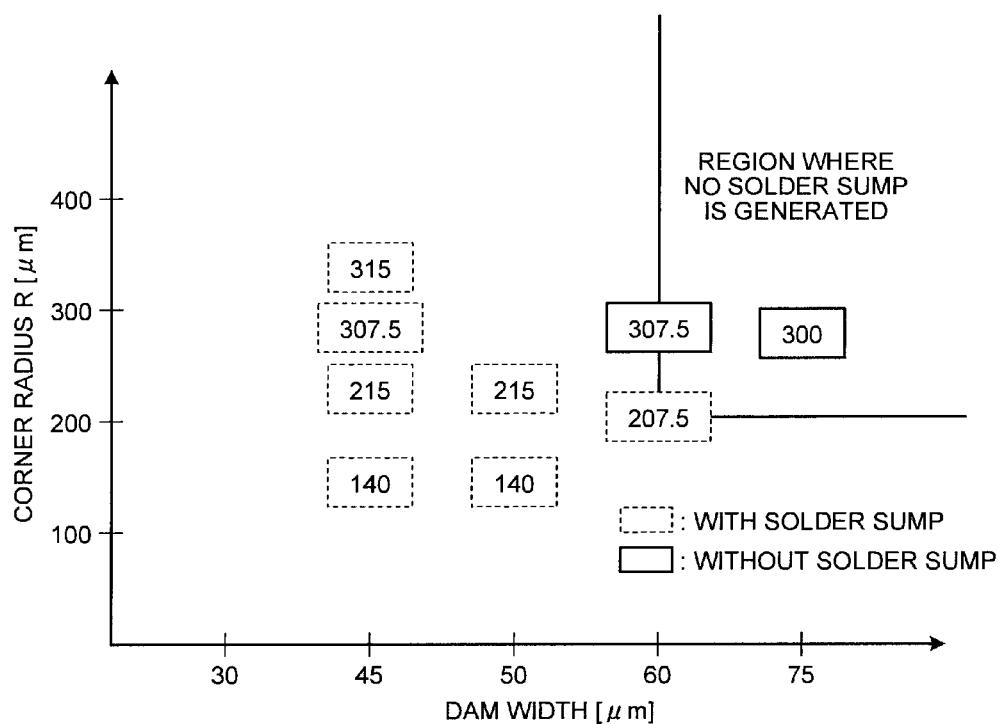
FIG. 9 is a view illustrating a region in which no solder sump is generated with reference to the relationship between the width of the dam and the radius R of the corner.

As for the dam designed in the present preferred embodiment illustrated in FIGS. 6A and 6B and the conventional dam designed in FIG. 7 and the like, FIG. 9 illustrates a region where no solder sump is generated by plotting the dam widths and the corner radii R. Every data plotted in FIG. 9 is acquired under the condition where the lateral width of the bump is 20 μm in plating and the height from bottom to top of the solder bump after reflowing is 18±2.7 μm. As is obvious from FIG. 9, when the dam width, that is, the difference between the inner diameter and the outer diameter of the quarter arc is 60 μm or more and the corner radius (the center radius) R of the quarter arc is greater than 207.5 μm, it is found that no solder sump is generated. FIG. 9 illustrates the result in the case where both of the solder dam and the bump are made of SnCu. However, a solder sump is generated when the surface tension of a solder cannot keep a desired dam shape, and therefore, it is construed that SnAg having substantially the same surface tension as that of SnCu also can produce the same result.

When the solder sump is generated, the height of the dam thereat (i.e., the height of the solder dam 10, as viewed from the top of Ni 43 in FIG. 5B) normally exceeds 200 μm, and further, reaches as much as about 300 μm. In this case, when a back side is ground in the state in which semiconductor chips (lower semiconductor chips) are integrally formed on a single wafer in a process (back side grind, hereinafter referred to as BSG) for reducing the thickness of the semiconductor device after the process illustrated in FIG. 5B, the back side is largely cut out since the solder sump projects largely. As a consequence, the wafer may be possibly cracked (i.e., a crack may occur) from the solder sump.

Even if no crack occurs during the BSG process for the lower semiconductor chip, the thickness of the semiconductor layer in the vicinity (at the back side) where the solder sump is generated is reduced. Consequently, the thin semiconductor device is finished, and therefore, deficiency such as bump non-connection occurs during flip chip connection. In other words, when the semiconductor devices are joined to each other via the bumps in order to achieve the COC structure in the upper semiconductor chip, the back sides are joined to each other in the state in which a recess is formed in the vicinity of the solder sump of the lower semiconductor chip since the back sides of the upper and lower semiconductor chips are joined in parallel reversely to each other. As a result, there arises a problem that the bump in the vicinity of the solder sump of the lower semiconductor chip and the bump of the upper semiconductor chip opposite thereto cannot be connected to each other.

Moreover, when the corner of the dam becomes high because the solder sump is formed thereat, the solder is collected at the solder sump. The other portion of the dam becomes low in height, thereby raising a problem that the dam cannot function sufficiently. That is to say, during the under-fill process, the dam except the collected portion becomes low in height at the dam where the solder sump is generated, and therefore, the overflow suppressing effect of the under-fill resin is reduced, thus possibly inducing adhesion of the resin to the outside beyond a specified region. Against the above-described problems, the technique capable of suppressing the generation of the solder sump in the semiconductor device has been demanded. In view of the above, the solder dam in the present preferred embodiment can prevent the solder sump from being generated, thus solving all of the above-described problems.

Although the description has been given of one substantially rectangular and annular dam in the above-described preferred embodiment, the same effect can be produced by avoiding the generation of the solder sump according to the design rule in the above-described preferred embodiment even if a plurality of substantially rectangular and annular dams having various side lengths are disposed in a multiple fashion. Additionally, although the description has been given of the COC structure consisting of the two semiconductor chips in the above-described preferred embodiment, the dam in the above-described preferred embodiment may be formed on the plurality of lower semiconductor chips by further laminating many semiconductor chips. Moreover, although the arc of the dam is quarter in the above-described preferred embodiment, an arc of a quarter or less may be formed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor apparatus comprising:
   a semiconductor substrate;
   a first semiconductor chip provided on the semiconductor substrate;
   a solder bump formed on the first semiconductor chip;
   a solder dam arranged in substantially a rectangular and annular manner outside around the solder bump on the first semiconductor chip by alternately connecting four sides and four quarter or less arcs;
   an electrode pad placed outside of the solder dam in the first semiconductor chip;
   a second semiconductor chip provided on the first semiconductor chip in electric connection to the first semiconductor chip via the solder bump; and
   an under-fill material filling a clearance between the first semiconductor chip and the second semiconductor chip inside of the solder dam,
   wherein:
      a difference between an inner diameter and an outer diameter of each the arcs is 60 μm, and a center radius of each the arcs is 307.5 μm; and
      the solder bump and the solder dam are made of SnCu or SnAg.

2. The semiconductor apparatus according to claim 1, wherein a height from bottom to top of the solder dam is 20±3 μm.

3. The semiconductor apparatus according to claim 1, further comprising:
   a second solder dam arranged in substantially a rectangular and annular manner outside around the solder dam on the first semiconductor chip by alternately connecting four sides and four quarter or less arcs, wherein:
      a difference between an inner diameter and an outer diameter of each of the arcs of the second solder dam is 60 μm or more, and
      a center radius of each of the arcs of the second solder dam is greater than 207.5 μm.

4. The semiconductor apparatus according to claim 1, wherein one of the first semiconductor chip and the second semiconductor chip is a memory chip whereas the other of the first semiconductor chip and the second semiconductor chip is a logic chip.

5. The semiconductor apparatus according to claim 1, wherein
the solder dam is formed on an under barrier metal formed on the first semiconductor chip.

6. The semiconductor apparatus according to claim 5, wherein
the solder bump is formed on the under barrier metal.

7. The semiconductor apparatus according to claim 5, wherein
the under barrier metal includes Ti and Cu.

8. The semiconductor apparatus according to claim 5, wherein
the solder dam is formed on Ni plated on the under barrier metal.

9. A semiconductor apparatus comprising:
a semiconductor substrate;
a first semiconductor chip provided on the semiconductor substrate;
a solder bump formed on the first semiconductor chip;
a solder dam arranged in substantially a rectangular and annular manner outside around the solder bump on the first semiconductor chip by alternately connecting four sides and four quarter or less arcs;
an electrode pad placed outside of the solder dam in the first semiconductor chip;
a second semiconductor chip provided on the first semiconductor chip in electric connection to the first semiconductor chip via the solder bump; and
an under-fill material filling a clearance between the first semiconductor chip and the second semiconductor chip inside of the solder dam,
wherein:
a difference between an inner diameter and an outer diameter of each the arcs is 75 μm, and a center radius of each the arcs is 300 μm; and
the solder bump and the solder dam are made of SnCu or SnAq.

10. The semiconductor apparatus according to claim 9, wherein a height from bottom to top of the solder dam is 20±3 μm.

11. The semiconductor apparatus according to claim 9, further comprising
a second solder dam arranged in substantially a rectangular and annular manner outside around the solder dam on the first semiconductor chip by alternately connecting four sides and four quarter or less arcs, wherein
a difference between an inner diameter and an outer diameter of each of the arcs of the second solder dam is 60 μm or more, and
a center radius of each of the arcs of the second solder dam is greater than 207.5 μm.

12. The semiconductor apparatus according to claim 9, wherein
one of the first semiconductor chip and the second semiconductor chip is a memory chip whereas the other of the first semiconductor chip and the second semiconductor chip is a logic chip.

13. The semiconductor apparatus according to claim 9, wherein
the solder dam is formed on an under barrier metal formed on the first semiconductor chip.

14. The semiconductor apparatus according to claim 13, wherein
the solder bump is formed on the under barrier metal.

15. The semiconductor apparatus according to claim 13, wherein
the under barrier metal includes Ti and Cu.

16. The semiconductor apparatus according to claim 13, wherein
the solder dam is formed on Ni plated on the under barrier metal.

* * * * *